(12) United States Patent
Han

(10) Patent No.: US 11,527,288 B2
(45) Date of Patent: Dec. 13, 2022

(54) MEMORY CELL AND OPERATING METHOD OF MEMORY CELL

(71) Applicant: SK hynix Inc., Icheon-si (KR)

(72) Inventor: Jae Hyun Han, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 8 days.

(21) Appl. No.: 17/192,762

(22) Filed: Mar. 4, 2021

(65) Prior Publication Data

US 2022/0068384 A1 Mar. 3, 2022

(30) Foreign Application Priority Data

Sep. 2, 2020 (KR) .................. 10-2020-0111938

(51) Int. Cl.
*G11C 11/00* (2006.01)
*G11C 13/00* (2006.01)

(52) U.S. Cl.
CPC ........ *G11C 13/0069* (2013.01); *G11C 13/004* (2013.01); *G11C 13/0004* (2013.01); *G11C 13/0038* (2013.01); *G11C 13/0097* (2013.01)

(58) Field of Classification Search
CPC ............ G11C 13/0069; G11C 13/0004; G11C 13/0038; G11C 13/004
USPC ............................................ 365/148
See application file for complete search history.

(56) References Cited

U.S. PATENT DOCUMENTS

| | | | |
|---|---|---|---|
| 2011/0134686 A1* | 6/2011 | Sohn | G11C 13/0028 711/E12.007 |
| 2014/0169068 A1* | 6/2014 | Lee | G11C 13/0069 365/148 |
| 2014/0355328 A1* | 12/2014 | Muller | G11C 11/2275 257/295 |
| 2019/0027218 A1 | 1/2019 | Tortorelli et al. | |

FOREIGN PATENT DOCUMENTS

KR 10-2018-0134124 A 12/2018

\* cited by examiner

*Primary Examiner* — Vu A Le

(57) ABSTRACT

A memory cell includes a first electrode, a second electrode, a variable resistance layer located between the first electrode and the second electrode, and a ferroelectric layer located between the variable resistance layer and the second electrode, wherein the variable resistance layer is maintained in an amorphous state during a program operation.

16 Claims, 14 Drawing Sheets

MEMORY CELL AND OPERATING METHOD OF MEMORY CELL

CROSS-REFERENCE TO RELATED APPLICATION

The present application claims priority under 35 U.S.C. § 119(a) to Korean patent application number 10-2020-0111938, filed on Sep. 2, 2020, in the Korean Intellectual Property Office, the entire disclosure of which is incorporated herein by reference.

BACKGROUND

1. Technical Field

The present disclosure generally relates to an electronic device, and more particularly, to a semiconductor device including a memory.

2. Related Art

Recently, with requirements of miniaturization, low power consumption, high performance, and diversification of electronic devices, semiconductor devices configured to store information are being required in various types of electronic devices such as computers and portable communication apparatuses. Therefore, there has been research on semiconductor devices configured to store data using characteristics of switching between different resistance states depending on a voltage or current being applied. Examples of such semiconductor devices may include a resistive random access memory (RRAM), a phase-change random access memory (PRAM), a ferroelectric random access memory (FRAM), a magnetic random access memory (MRAM), an electronic fuse (E-fuse), and so forth.

SUMMARY

Various embodiments of the present disclosure are directed to an electronic device capable of improving operating characteristics and reliability of memory cells.

According to an embodiment, a memory cell may include a first electrode, a second electrode, a variable resistance layer located between the first electrode and the second electrode, and a ferroelectric layer located between the variable resistance layer and the second electrode, wherein the variable resistance layer is maintained in an amorphous state during a program operation.

According to an embodiment, a method of operating a memory cell including a first electrode, a second electrode, a variable resistance layer located between the first electrode and the second electrode, and a ferroelectric layer located between the variable resistance layer and the second electrode may include applying a positive program voltage to the first electrode, wherein the positive program voltage causes polarization of the ferroelectric layer, and applying a read voltage that does not polarize of the ferroelectric layer to the memory cell.

According to an embodiment, a method of operating a memory cell including a first electrode, a second electrode, a switching layer located between the first electrode and the second electrode, and a ferroelectric layer located between the switching layer and the second electrode may include applying a positive program voltage to the first electrode, wherein the positive program voltage causes polarization of the ferroelectric layer, and applying a read voltage that does not cause the polarization of the ferroelectric layer to the memory cell.

DETAILED DESCRIPTION

Hereinafter, specific structural or functional descriptions of embodiments in accordance with concepts that are disclosed in this specification are illustrated only to describe the examples of embodiments in accordance with the concepts, and the examples of embodiments in accordance with the concepts may be carried out by various forms, but the descriptions are not limited to the examples of embodiments described in this specification.

Figure 1:
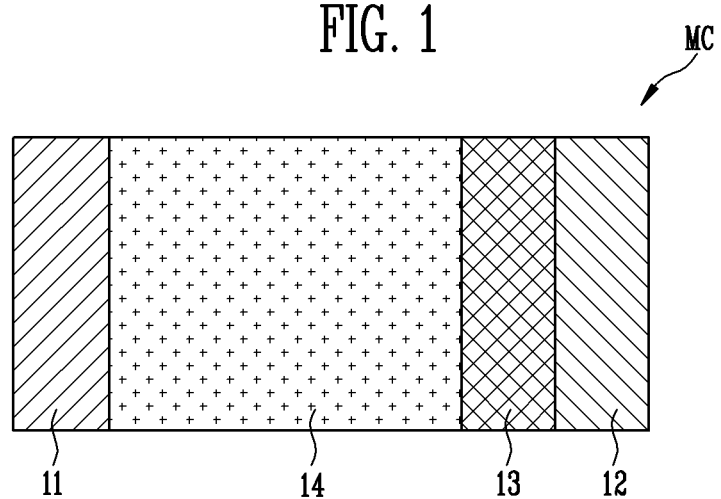
FIG. 1 is a diagram illustrating a configuration of a semiconductor device according to an embodiment of the present disclosure.

FIG. 1 is a diagram illustrating a configuration of a semiconductor device according to an embodiment of the present disclosure.

Referring to FIG. 1, a semiconductor device may include a first electrode 11, a second electrode 12, a switching layer 14 and a ferroelectric layer 13. The semiconductor device may include a memory cell MC. The first electrode 11, the second electrode 12, the switching layer 14 and the ferroelectric layer 13 may form the memory cell MC. The memory cell MC may be a data storage and may also serve as a select element.

The switching layer 14 may be located between the first electrode 11 and the second electrode 12. The switching layer 14 may include a switching material having characteristics such that a current hardly flows when the magnitude of a voltage or current being applied is equal to or less than a threshold value and such that a current may flow when the magnitude of the voltage or current exceeds the threshold value. The switching material may be a chalcogenide-based material such as Arsenic tritelluride ($As_2Te_3$), Arsenic ($As_2$), or Arsenic triselenide ($As_2Se_3$). In another example, the switching material may include $NbO_2$ or $TiO_2$ used in a metal insulator transition (MIT) device. In a further example, the switching material may include $ZrO_2(Y_2O_3)$, $Bi_2O_3$—BaO, $(La_2O_3) \times (CeO_2)_{1-x}$, or the like used in a mixed ion-electron conducting (MIEC) device. Hereinafter, an embodiment in which the switching layer 14 includes a chalcogenide-based material maintaining an amorphous state is described below.

The ferroelectric layer 13 may be located between the switching layer 14 and the second electrode 12. The ferroelectric layer 13 may include a ferroelectric material. Polarization of the ferroelectric layer 13 may be caused by a program voltage applied to the memory cell MC, and as a result, the ferroelectric layer 13 may have a remanent polarization. When a positive program voltage is applied, the ferroelectric layer 13 may have a positive polarization state. When a negative program voltage is applied, the ferroelectric layer 13 may have a negative polarization state. The ferroelectric layer 13 may include metal oxide. More specifically, the ferroelectric layer 13 may include hafnium oxide, zirconium oxide, hafnium-zirconium oxide, or a combination thereof. Alternatively, the ferroelectric layer 13 may include a ferroelectric material having a perovskite structure such as PZT ($PbZr_xTi_{1-x}O_3$), $BaTiO_3$, or $PbTiO_3$. The ferroelectric layer 13 may include impurities such as Si, Al, Zr, Y, La, Gd, or Sr.

The first electrode 11 or the second electrode 12 may be electrically coupled to a bit line or a word line. For example, the first electrode 11 may be coupled to the bit line and the second electrode 12 may be electrically coupled to the word line. However, in another example, the first electrode 11 may be coupled to the word line and the second electrode 12 may be electrically coupled to the bit line. The first electrode 11 and the second electrode 12 may include, for example, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), or a combination thereof.

According to the above-described structure, a threshold voltage of the memory cell MC may be determined depending on the remanent polarization of the ferroelectric layer 13. By including the ferroelectric layer 13 in the select element, which includes the switching layer 14, the memory cell MC may realize switching characteristics that allow the storing of data according to the polarization state of the ferroelectric layer 13.

The semiconductor device may include a cell array, a row decoder, a column decoder, a read and write circuit, a control logic circuit, a voltage generator and the like. The semiconductor device may communicate with a controller. When the controller receives a read/write request from the host, the controller may control the semiconductor device to write data into the semiconductor device or to read data stored in the semiconductor device.

The cell array may be coupled to the row decoder through row lines and coupled to the column decoder through column lines. The cell array may include the memory cells MC coupled between the row lines and the column lines. The row lines may be word lines and column lines may be bit lines, or the row lines may be bit lines and the column lines may be word lines.

The control logic circuit may be coupled to the row decoder, the column decoder, the read and write circuit and the voltage generator. The control logic circuit may control the row decoder, the column decoder, the read and write circuit and the voltage generator to perform an internal operation according to a command from the controller.

When the control logic circuit receives a program command, the control logic circuit may control the read and write circuit to perform a positive program operation. Application of a positive program voltage to the first electrode 11 of the selected memory cell MC may cause polarization of the ferroelectric layer 13. In a negative program operation, a negative program voltage may be applied to the first electrode 11 and may cause polarization of the ferroelectric layer 13. When the control logic circuit receives a read command, the control logic circuit may control the read and write circuit to perform a read operation to apply a read voltage to the first electrode 11 of the selected memory cell MC, which does not cause polarization of the ferroelectric layer 13.

Figure 2A:
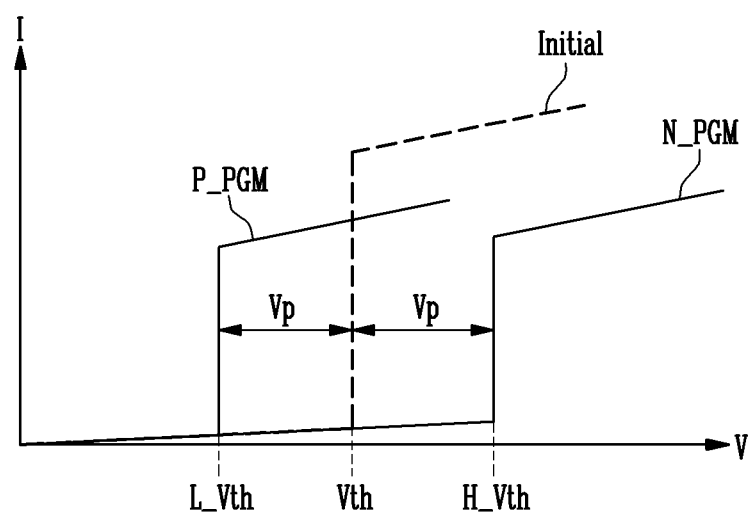
FIGS. 2A and 2B are graphs illustrating operating characteristics of a semiconductor device according to an embodiment of the present disclosure.
Figure 2B:
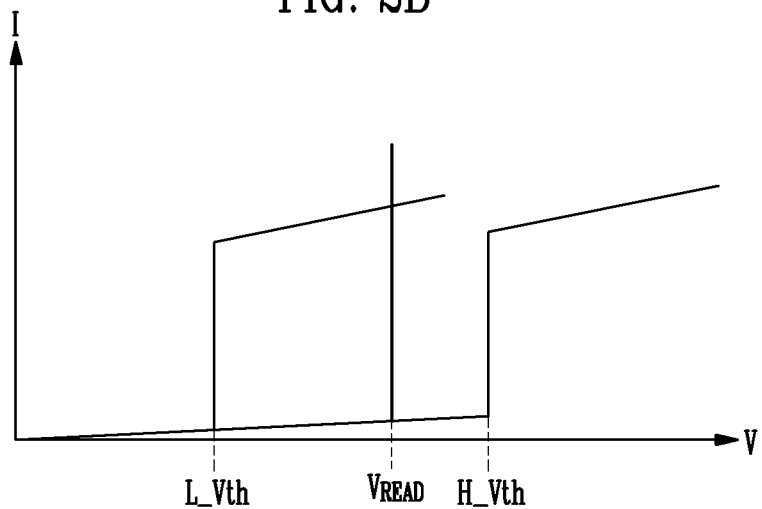

FIGS. 2A and 2B are graphs illustrating operating characteristics of a semiconductor device according to an embodiment of the present disclosure. In the graphs, the X-axis represents a voltage (V) applied to a memory cell and the Y-axis represents a current (I) flowing through the memory cell.

FIG. 2A shows a change in a threshold voltage of a memory cell MC including a switching layer 14 and a ferroelectric layer 13 by a program operation. A dotted line (Initial) indicates an initial state of the ferroelectric layer 13, which is not polarized. Since the ferroelectric layer 13 is not polarized, the memory cell MC may have a threshold voltage Vth according to material properties of the switching layer 14 and the ferroelectric layer 13.

A solid line (P_PGM) may indicate a threshold voltage L_Vth of the positive-programmed memory cell MC. A positive program voltage may be applied to the memory cell MC and the ferroelectric layer 13 may be polarized in a positive direction. Therefore, the memory cell MC may have the threshold voltage L_Vth decreased from the initial state by a remanent polarization Vp of the ferroelectric layer 13. The positive program may refer to a set operation and the programmed memory cell MC may have a set state.

A solid line (N_PGM) indicates a threshold voltage H_Vth of the negative-programmed memory cell MC. A negative program voltage may be applied to the memory cell MC and the ferroelectric layer 13 may be polarized in a negative direction. Therefore, the memory cell MC may have the threshold voltage H_Vth increased from the initial state by the remanent polarization Vp of the ferroelectric layer 13. The negative program may refer to a reset operation and the programmed memory cell MC may have a reset state.

There may be a difference of 2Vp between the threshold voltage L_Vth in the set state and the threshold voltage H_Vth in the reset state. Therefore, a read memory window as much as 2Vp may be secured.

Referring to FIG. 2B, data stored in the memory cell MC may be read using a read voltage $V_{READ}$. A level of the read voltage $V_{READ}$ may be higher than that of the threshold voltage L_Vth in the set state and may be lower than that of the threshold voltage H_Vth in the reset state. When the read voltage $V_{READ}$ is applied to the memory cell MC, the memory cell MC may be turned on or off depending on a program state of the memory cell MC. When the memory cell MC has the set state, and the read voltage $V_{READ}$ is applied, the memory cell MC may be turned on so that the current flows therethrough. When the memory cell MC has the reset state and the read voltage $V_{READ}$ is applied, the memory cell MC may be turned off so that the current may not flow therethrough. Therefore, the data stored in the memory cell MC may be read.

Figure 3A:
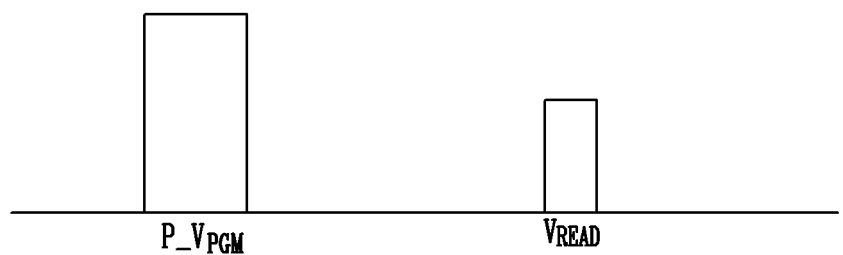
FIGS. 3A and 3B are diagrams illustrating a method of operating a semiconductor device according to an embodiment of the present disclosure.
Figure 3B:
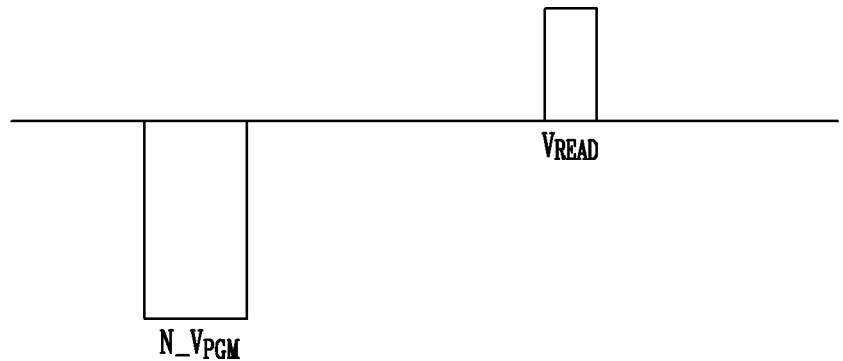

FIGS. 3A and 3B are diagrams illustrating a method of operating a semiconductor device according to an embodiment of the present disclosure. FIG. 3A shows the waveforms of a program voltage and a read voltage relating to a positive program operation. FIG. 3B shows the waveforms of a program voltage and a read voltage relating to a negative program operation.

Referring to FIG. 3A, during a positive program operation, a positive program voltage $P\_V_{PGM}$ may be applied to a memory cell MC. The positive program voltage $P\_V_{PGM}$ may have a level that is high enough to cause polarization of the ferroelectric layer 13. According to an embodiment, the positive program voltage $P\_V_{PGM}$ may have a higher level than a coercive field that causes polarization of the ferroelectric material. Through the positive program operation, the memory cell MC may be programmed to a set state in which the memory cell MC has a low threshold voltage. The read voltage $V_{READ}$ may have a positive level. The read voltage $V_{READ}$ may be too low to cause the polarization of the ferroelectric layer 13. The level of the read voltage $V_{READ}$ may be lower level than that of the positive program voltage $P\_V_{PGM}$ and lower than that of the coercive field.

Referring to FIG. 3B, during a negative program operation, a negative program voltage $N\_V_{PGM}$ may be applied to a memory cell MC. The negative program voltage $N\_V_{PGM}$ may have a level that is high enough to cause polarization of the ferroelectric layer 13. According to an embodiment, the absolute value of the negative program voltage $N\_V_{PGM}$ may be greater than the absolute value of the coercive field that causes polarization of the ferroelectric material. Through the negative program operation, the memory cell MC may be programmed to a reset state in which the memory cell MC has a high threshold voltage. The read voltage $V_{READ}$ may have a positive level. The read voltage $VR_{EAD}$ may have too low a level to cause the polarization of the ferroelectric layer 13. The absolute value of the read voltage $V_{READ}$ may be smaller than that of the negative program voltage $N\_V_{PGM}$ and that of the coercive field.

Figure 4A:
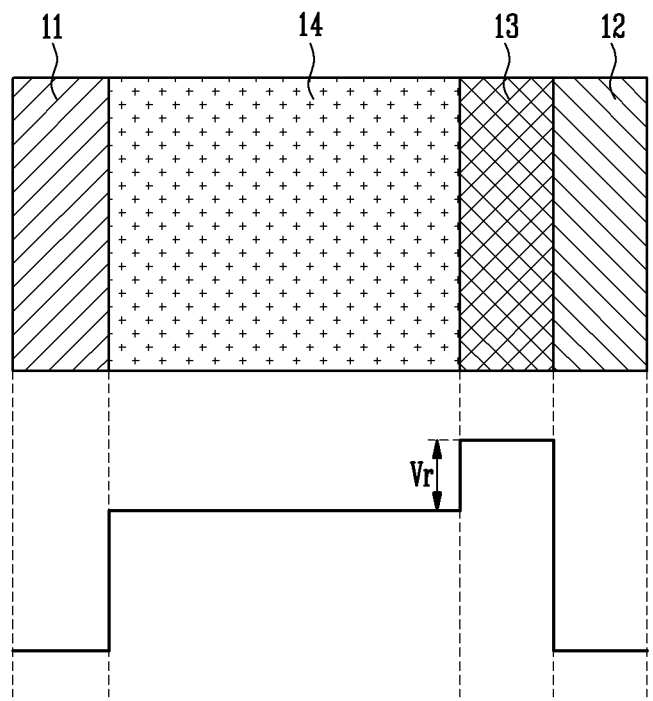
FIGS. 4A to 4C are diagrams illustrating a method of operating a semiconductor device according to an embodiment of the present disclosure.
Figure 4B:
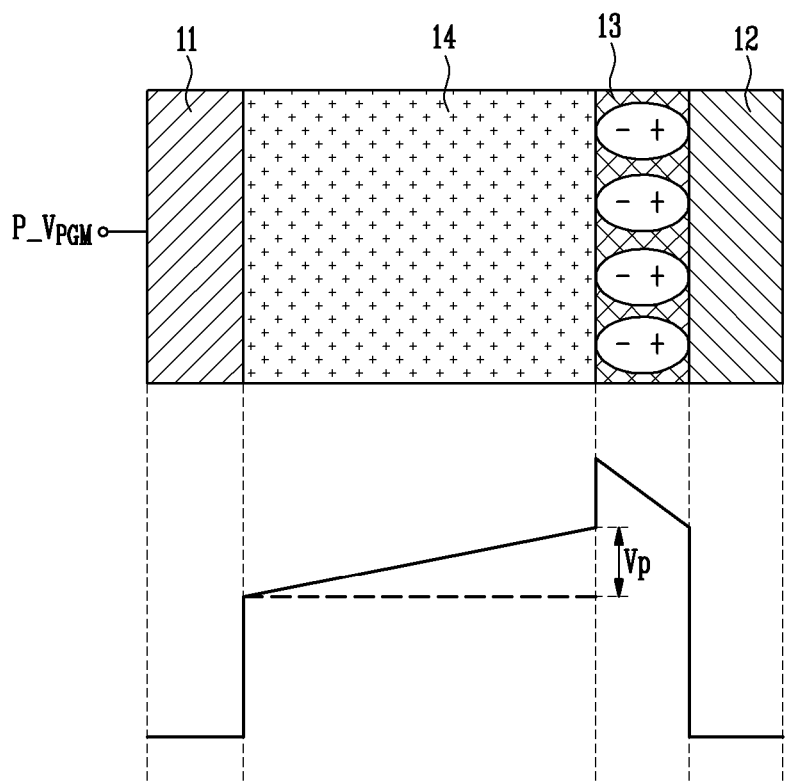
Figure 4C:
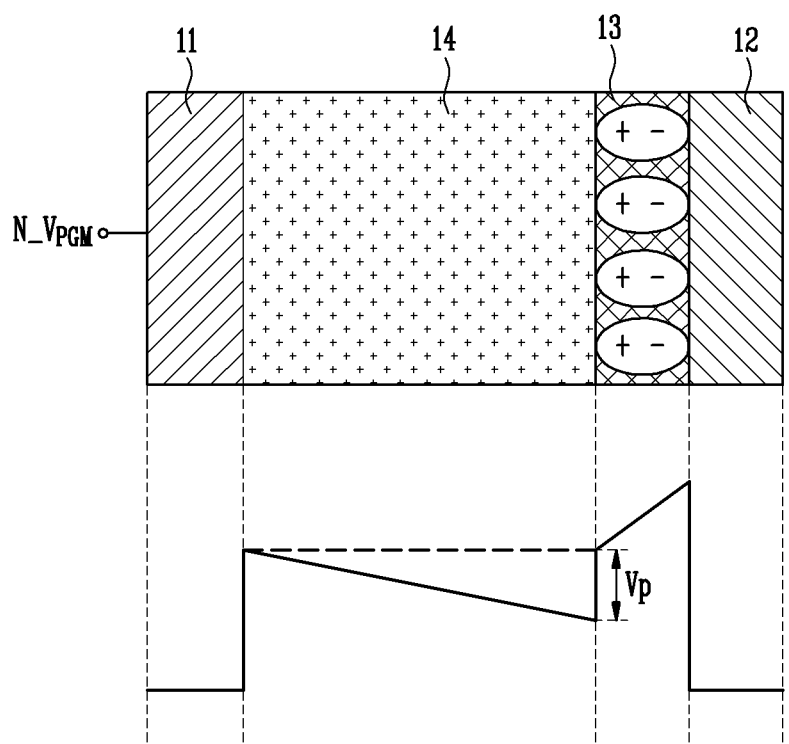

FIGS. 4A to 4C are diagrams illustrating a method of operating a semiconductor device according to an embodiment of the present disclosure. Each drawing includes a cross-sectional view of a memory cell and a band diagram. A memory cell MC may include a first electrode 11, a second electrode 12, a ferroelectric layer 13 and a switching layer 14. The first electrode 11 or the second electrode 12 may include metal.

FIG. 4A shows an initial state of the memory cell MC. In the initial state, the ferroelectric layer 13 may have a higher potential than the switching layer 14 and serve as a barrier for supplying electrons to the switching layer 14. A height Vr of the barrier may be determined by physical properties and thickness of the ferroelectric layer 13. In the initial state, the memory cell MC may have the threshold voltage Vth.

FIG. 4B shows a set state of the memory cell MC programmed by a positive program operation. During the positive program operation, a voltage difference may be caused between the first electrode 11 and the second electrode 12 so as to make a voltage level of the first electrode 11 higher than a voltage level of the second electrode 12. According to an embodiment, the positive program voltage $P\_V_{PGM}$ may be applied to the first electrode 11 of the memory cell MC and the second electrode 12 thereof may be connected to a ground. In the ferroelectric layer 13, negative charges may accumulate at the interface between the switching layer 14 and the ferroelectric layer 13 by the applied positive program voltage $P\_V_{PGM}$, and the ferroelectric layer 13 may be polarized in a positive direction. Because the ferroelectric layer 13 has a positive polarization state, the threshold voltage of the memory cell MC may be decreased by the remanent polarization Vp of the ferroelectric layer 13. In the set state, therefore, a threshold voltage Vth' of the memory cell MC may satisfy [Vth−Vp].

FIG. 4C shows a reset state of the memory cell MC programmed by a negative program operation. The negative program voltage $N\_V_{PGM}$ may be applied to the first electrode 11 of the memory cell MC. In the ferroelectric layer 13, positive charges may accumulate at the interface between the switching layer 14 and the ferroelectric layer 13 by applying the negative program voltage $N\_V_{PGM}$, and the ferroelectric layer 13 may be polarized in a negative direction. Because the ferroelectric layer 13 has a negative polarization state, the threshold voltage of the memory cell MC may be increased by the remanent polarization Vp of the ferroelectric layer 13. Thus, in the reset state, a threshold voltage Vth" of the memory cell MC may satisfy [Vth+Vp].

Figure 5A:
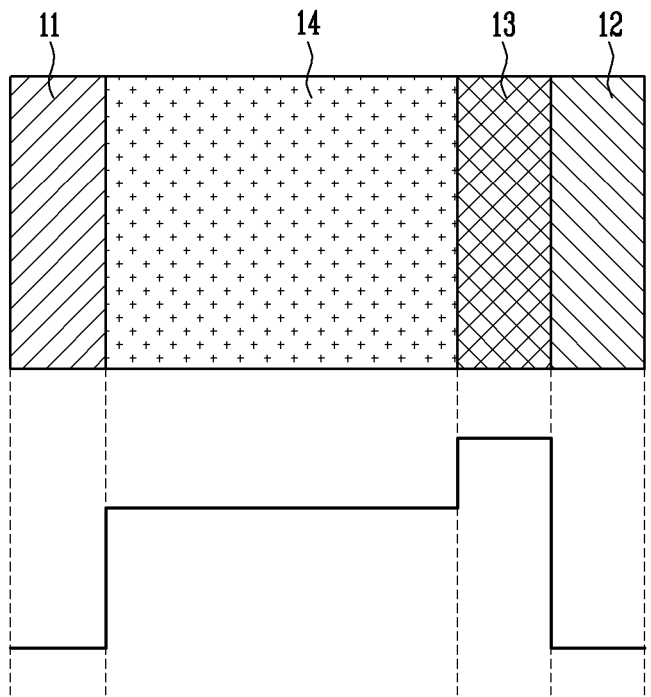
FIGS. 5A to 5C are diagrams illustrating a method of operating a semiconductor device according to an embodiment of the present disclosure.
Figure 5B:
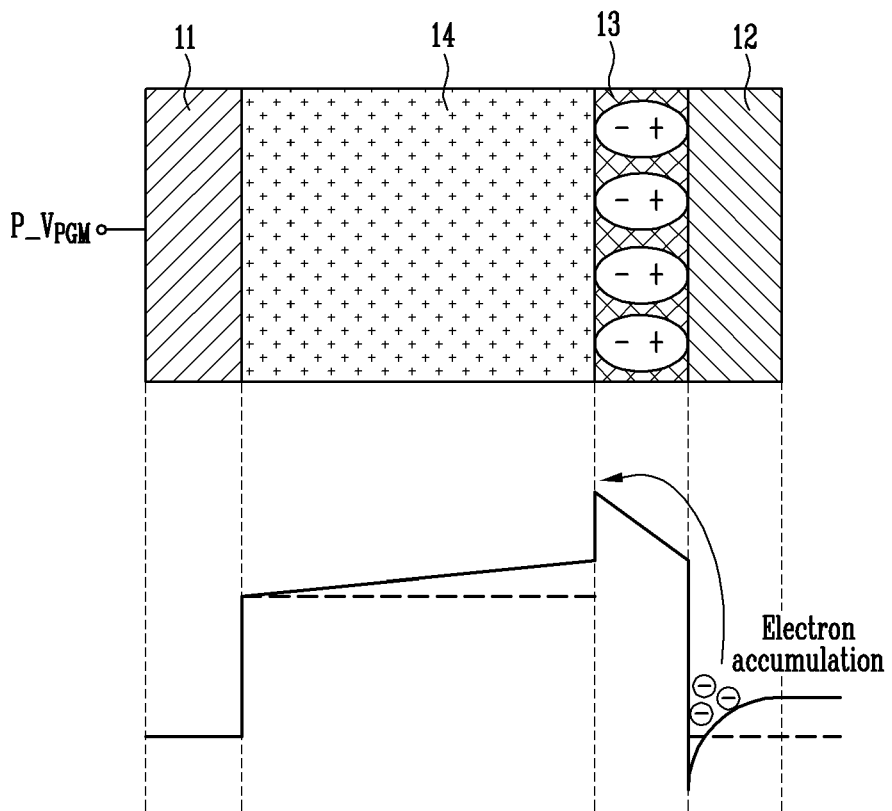
Figure 5C:
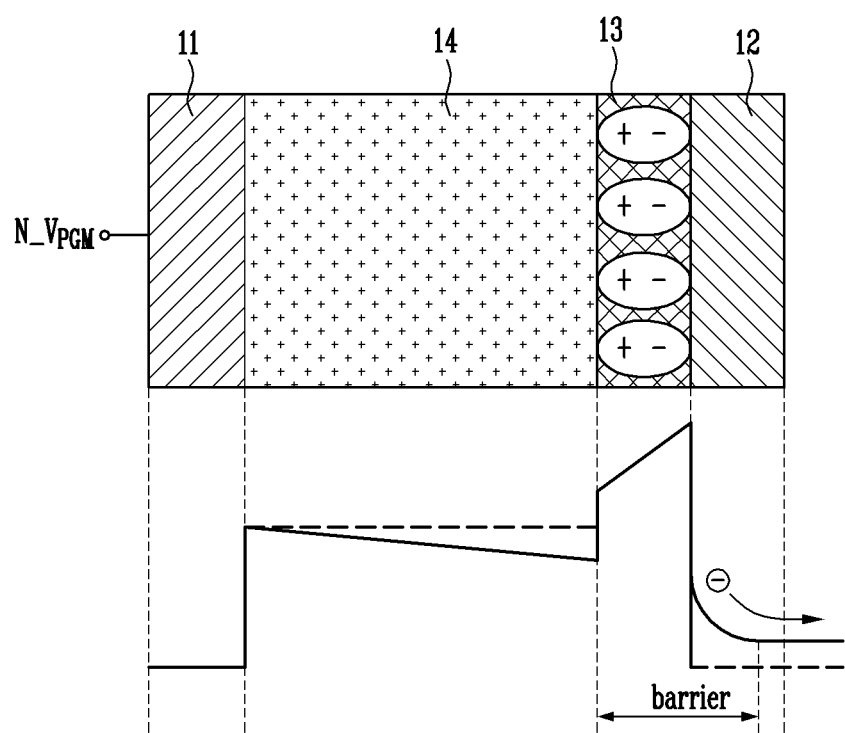

FIGS. 5A to 5C are diagrams illustrating a method of operating a semiconductor device according to an embodiment of the present disclosure. Each drawing includes a cross-sectional view of a memory cell and a band diagram. A memory cell MC may include a first electrode 11, a second electrode 12, a ferroelectric layer 13 and a switching layer 14. The first electrode 11 or the second electrode 12 may include a semimetal similar to a semiconductor, or a semiconductor material such as polysilicon.

FIG. 5A shows an initial state of the memory cell MC. In the initial state, the ferroelectric layer 13 may have a higher potential than the switching layer 14. The ferroelectric layer 13 may serve as a barrier when supplying electrons to the switching layer 14.

FIG. 5B shows a set state of the memory cell MC programmed by a positive program operation. The positive program voltage $P\_V_{PGM}$ may be applied to the first electrode 11 of the memory cell MC. In the ferroelectric layer 13, negative charges may be accumulated at the interface between the switching layer 14 and the ferroelectric layer 13 by application of the positive program voltage $P\_V_{PGM}$, and the ferroelectric layer 13 may be polarized in a positive direction. Because the second electrode 12 has semimetals or semiconductor materials, in the second electrode 12, electrons may accumulate at the interface between the ferroelectric layer 13 and the second electrode 12, and band lowering effects may be increased. Therefore, electrons may be more easily supplied when the positive program voltage $P\_V_{PGM}$ is applied to the first electrode 11. As a result, the threshold voltage in the set state may be further lowered as compared to an embodiment in which the second electrode 12 includes metal.

FIG. 5C shows a reset state of the memory cell MC programmed by a negative program operation. The negative program voltage $N\_V_{PGM}$ may be applied to the first electrode 11 of the memory cell MC. In the ferroelectric layer 13, positive charges may be accumulated at the interface between the switching layer 14 and the ferroelectric layer 13 by applying the negative program voltage $N\_V_{PGM}$, and the ferroelectric layer 13 may be polarized in a negative direction. Due to the polarization of the ferroelectric layer 13, a depletion region may be formed in the second electrode 12 adjacent to the ferroelectric layer 13, and so an effective barrier length may be increased. Therefore, it may be difficult for electrons to tunnel, and current flow may be reduced. The threshold voltage in the reset state may be further increased as compared to an embodiment in which the second electrode 12 includes metal.

Figure 6:
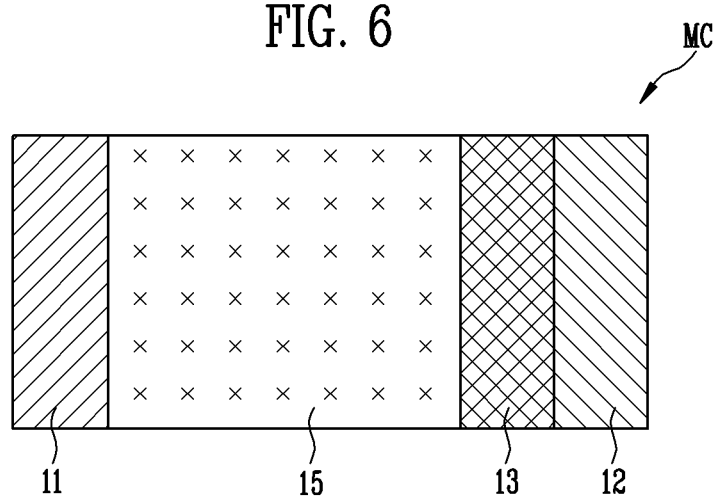
FIG. 6 is a diagram illustrating a configuration of a semiconductor device according to an embodiment of the present disclosure.

FIG. 6 is a diagram illustrating a configuration of a semiconductor device according to an embodiment of the present disclosure. Descriptions of certain elements that have been discussed above are omitted below for the sake of brevity.

Referring to FIG. 6, a semiconductor device may include a first electrode 11, a second electrode 12, a variable resistance layer 15 and a ferroelectric layer 13. The semiconductor device may include a memory cell MC. The first electrode 11, the second electrode 12, the variable resistance layer 15 and the ferroelectric layer 13 may form the memory cell MC. The memory cell MC may be a data storage and may also serve as a select element.

The variable resistance layer 15 may be located between the first electrode 11 and the second electrode 12. The variable resistance layer 15 may include a resistive material and may reversibly transition between different resistance states according to a voltage or current being applied.

The variable resistance layer 15 may include, for example, a transition metal oxide, or a metal oxide such as a perovskite-based material. Therefore, data may be stored in the memory cell MC as an electrical path is formed or degraded in the variable resistance layer 15.

The variable resistance layer 15 may have a magnetic tunnel junction (MTJ) structure. The variable resistance layer 15 may include a magnetization fixed layer, a magnetization free layer, and a tunnel barrier layer interposed therebetween. For example, each of the magnetization fixed layer and the magnetization free layer may include a magnetic material, and the tunnel barrier layer may include oxide such as for example magnesium (Mg), aluminum (Al), zinc (Zn), or titanium (Ti) oxide. A magnetization direction of the magnetization free layer may be changed by spin torque of electrons in the applied current. Therefore, data may be stored in the memory cell MC, depending on changes in magnetization direction of the magnetization free layer with respect to the magnetization direction of the magnetization fixed layer.

The variable resistance layer 15 may include a phase change material and a chalcogenide. The variable resistance layer 15 may include, for example, chalcogenide glass, chalcogenide alloys, and the like. The variable resistance layer 15 may include silicon (Si), germanium (Ge), antimony (Sb), tellurium (Te), bismuth (Bi), indium (In), tin (Sn), selenium (Se), or a combination thereof. For example, the variable resistance layer 15 may be Ge—Sb—Te (GST), for example, $Ge_2Sb_2Te_5$, $Ge_2Sb_2Te_7$, $Ge_1Sb_2Te_4$, or $Ge_1Sb_4Te_7$. A phase of the variable resistance layer 15 may be changed by a program operation. By a set operation, the variable resistance layer 15 may have a low-resistance crystalline state. By a reset operation, the variable resistance layer 15 may have a high-resistance amorphous state. Therefore, by using a resistance difference depending on the phase of the variable resistance layer 15, data may be stored in the memory cell MC.

The variable resistance layer 15 may include a variable resistance material in which resistance varies without a phase change, and may include a chalcogenide-based material. The variable resistance layer 15 may include, for example, e germanium (Ge), antimony (Sb), tellurium (Te), arsenic (As), selenium (Se), silicon (Si), indium (In), tin (Sn), sulfur (S), gallium (Ga), or a combination thereof.

The variable resistance layer 15 may have a single phase, and this phase may be maintained during a program operation. According to an embodiment, the variable resistance layer 15 may be a chalcogenide layer that maintains an amorphous state. The variable resistance layer 15 may have an amorphous state and may not change into a crystalline state during the program operation. Therefore, a threshold voltage of the memory cell MC may be changed depending on a program voltage applied to the memory cell MC, and the memory cell MC may be programmed into at least two states. When a negative program voltage is applied to the memory cell MC, the variable resistance layer 15 may have a high-resistance amorphous state. When a positive program voltage is applied to the memory cell MC, the variable resistance layer 15 may have a low-resistance amorphous state. Therefore, by using the resistance difference of the variable resistance layer 15, data may be stored in the memory cell MC.

The ferroelectric layer 13 may be located between the variable resistance layer 15 and the second electrode 12. The ferroelectric layer 13 may include a ferroelectric material. The polarization of the ferroelectric layer 13 may be caused by a program voltage applied to the memory cell MC, and the ferroelectric layer 13 may have remanent polarization. When a positive program voltage is applied, the ferroelectric layer 13 may have a positive polarization state. When a negative program voltage is applied, the ferroelectric layer 13 may have a negative polarization state. The ferroelectric layer 13 may include metal oxide. The ferroelectric layer 13 may include, for example, hafnium oxide, zirconium oxide, hafnium-zirconium oxide, or a combination thereof. Alternatively, the ferroelectric layer 13 may include a ferroelectric material having a perovskite structure such as PZT ($PbZr_xTi_{1-x}O_3$), $BaTiO_3$, or $PbTiO_3$. The ferroelectric layer 13 may include impurities such as Si, Al, Zr, Y, La, Gd, or Sr.

The first electrode 11 or the second electrode 12 may be electrically coupled to a bit line or a word line. For example, the first electrode 11 may be coupled to the bit line and the second electrode 12 may be electrically coupled to the word line. However, in another example, the first electrode 11 may be coupled to the word line and the second electrode 12 may be electrically coupled to the bit line. The first electrode 11 or the second electrode 12 may include, for example, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), or a combination thereof.

According to the above-described structure, the threshold voltage of the memory cell MC may be determined depending on the resistance state of the variable resistance layer 15 and the polarization state of the ferroelectric layer 13. When the memory cell MC includes the ferroelectric layer 13, the memory cell MC may be programmed into a lower or higher threshold voltage when compared to a memory cell that does not include a ferroelectric layer. As a result, a read margin may be enlarged to improve operating characteristics and reliability.

Figure 7:
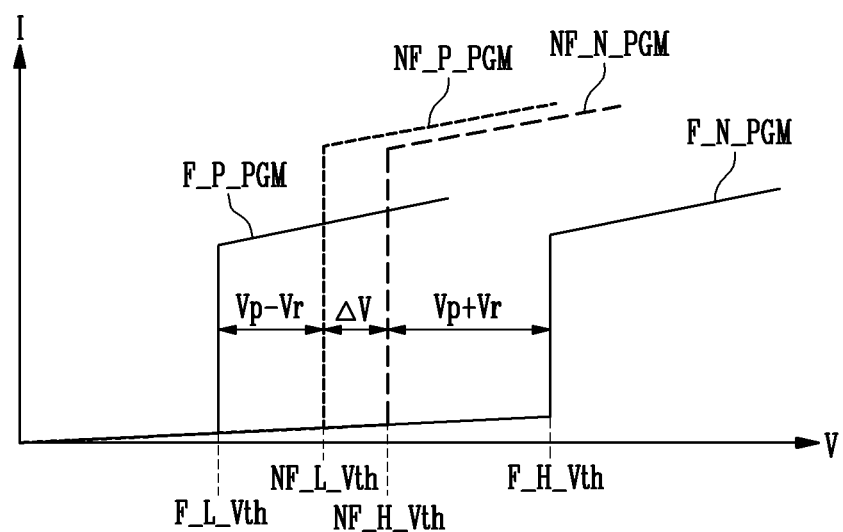
FIG. 7 is a graph illustrating operating characteristics of a semiconductor device according to an embodiment of the present disclosure and a reference semiconductor device.

FIG. 7 is a graph illustrating operating characteristics of a semiconductor device according to an embodiment of the present disclosure and a reference semiconductor device. In the graph, the X-axis represents a voltage (V) applied to a memory cell and the Y-axis represents a current (I) flowing through a memory cell. Descriptions of certain elements that have been discussed above are omitted below for the sake of brevity.

Referring to FIG. 7, dashed lines (NF_P_PGM and NF_N_PGM) may indicate variations in threshold voltage of a reference memory cell in a reference semiconductor device resulting from a program operation. The reference memory cell does not include a ferroelectric layer such as a ferroelectric layer 13. By applying a positive program operation NF_P_PGM, the reference memory cell may be programmed into a set state so that the reference memory cell may have a low threshold voltage NF_L_Vth. By applying a negative program operation NF_N_PGM, the reference memory cell may be programmed into a reset state so that the reference memory cell may have a high threshold voltage NF_H_Vth. There may be a voltage difference ΔV between the high threshold voltage NF_H_Vth and the low threshold voltage NF_L_Vth.

Solid lines (F_P_PGM and F_N_PGM) may show variations in threshold voltage of a memory cell MC of embodiments of the disclosure resulting from a program operation. The memory cell MC may include a variable resistance layer 15 and a ferroelectric layer 13. By applying a positive program operation F_P_PGM, the memory cell MC may be programmed into a set state such that the memory cell MC may have a first threshold voltage F_L_Vth. By applying a negative program operation F_N_PGM, the memory cell MC may be programmed into a reset state such that the memory cell MC may have a second threshold voltage F_H_Vth. The second threshold voltage F_H_Vth may have a greater voltage level than a first threshold voltage F_L_Vth. There may exist a voltage difference (ΔV+2Vp) between the second threshold voltage F_H_Vth and the first threshold voltage F_L_Vth.

In embodiments of the disclosure, the memory cell MC in the set state may have a low-resistance amorphous state. In addition, the ferroelectric layer 13 may be polarized in a positive direction and a threshold voltage thereof may be reduced by the remanent polarization Vp. In the set state, the memory cell MC may have the first threshold voltage F_L_Vth, which is lower than the threshold voltage NF_L_Vth of the reference memory cell. For example, the absolute value of the first threshold voltage F_L_Vth may be greater than that of the threshold voltage NF_L_Vth by (Vp−Vr). In other instances, the absolute value of the first threshold voltage F_L_Vth may be greater than the absolute value of the threshold voltage NF_L_Vth.

In embodiments of the disclosure, the variable resistance layer 15 of the memory cell MC in the reset state may have a high-resistance amorphous state. In addition, the ferroelectric layer 13 may be polarized in a negative direction and a threshold voltage thereof may be increased by the remanent polarization Vp. In the reset state, the memory cell MC may have a second threshold voltage F_H_Vth, which is greater than the threshold voltage NF_H_Vth of the reference memory cell. For example, in the reset state, the second threshold voltage F_H_Vth of the memory cell MC may be greater than the threshold voltage NF_H_Vth of the reference memory cell by (Vp+Vr).

Therefore, the memory cell MC may have a larger read memory window than the reference memory cell. The memory cell MC may be programmed into two or more states by controlling a positive program voltage and a negative program voltage.

Figure 8:
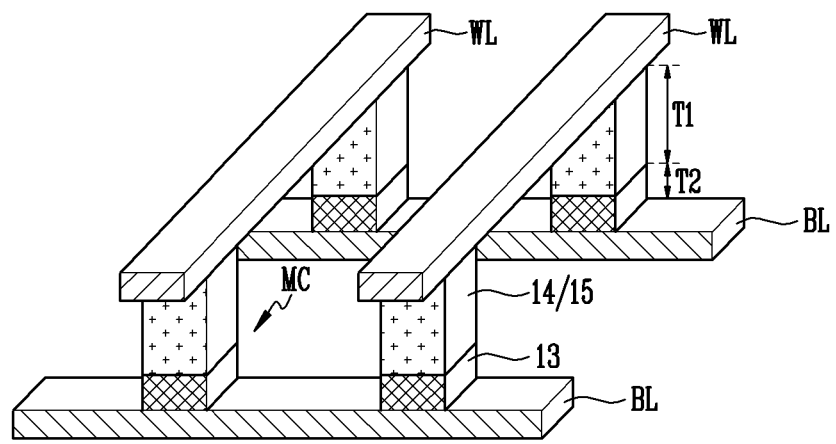
FIG. 8 is a diagram illustrating a configuration of a semiconductor device according to an embodiment of the present disclosure.
Figure 8:
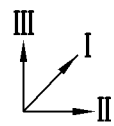

FIG. 8 is a diagram illustrating a configuration of a semiconductor device according to an embodiment of the present disclosure. Descriptions of certain elements that have been discussed above are omitted below for the sake of brevity.

Referring to FIG. 8, a semiconductor device may include word lines WL, bit lines BL and memory cells MC. The word lines WL may extend in a first direction I. The bit lines BL may extend in a second direction II crossing the first direction I. The bit lines BL or the word lines WL may include, for example, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), polysilicon, or a combination thereof.

The memory cells MC may be located at areas of intersection between the word lines WL and the bit lines BL. According to an embodiment, each of the memory cells MC may include a ferroelectric layer 13 and a switching layer 14. The ferroelectric layer 13 and the switching layer 14 may be stacked in a third direction III. According to an embodiment, each of the memory cells MC may include a ferroelectric layer 13 and a variable resistance layer 15. The ferroelectric layer 13 and the variable resistance layer 15 may be stacked in the third direction III. The third direction III may refer to a direction protruding from the plane defined by the first direction I and the second direction II, and may protrude perpendicularly to the plane.

The remanent polarization Vp of the ferroelectric layer 13 may increase as the thickness T2 of the ferroelectric layer 13 increases in the third direction III. As a result, a memory margin may also be increased. However, when the thickness T2 is too large, an on-current may be reduced. Therefore, the ferroelectric layer 13 may have a thickness smaller than the thickness of the switching layer 14 or the variable resistance layer 15 (T2<T1). The ferroelectric layer 13 may have the thickness T2 of a few nanometers (nm).

Although not illustrated in FIG. 8, each of the memory cells MC may further include a first electrode interposed between the word line WL and the variable resistance layer 15/the switching layer 14, or a second electrode interposed between the bit line BL and the ferroelectric layer 13. Alternatively, a portion of the word line WL may be a first electrode, or a portion of the bit line BL may be a second electrode.

FIG. 8 illustrates memory cells MC arranged in the first direction I and the second direction II. However, the memory cells MC may be stacked in the third direction III. The bit lines BL and the word lines WL may be disposed in alternately stacked layers spaced apart in the third direction III, and the memory cells MC may be located between the stacked bit lines BL and word lines WL.

Figure 9A:
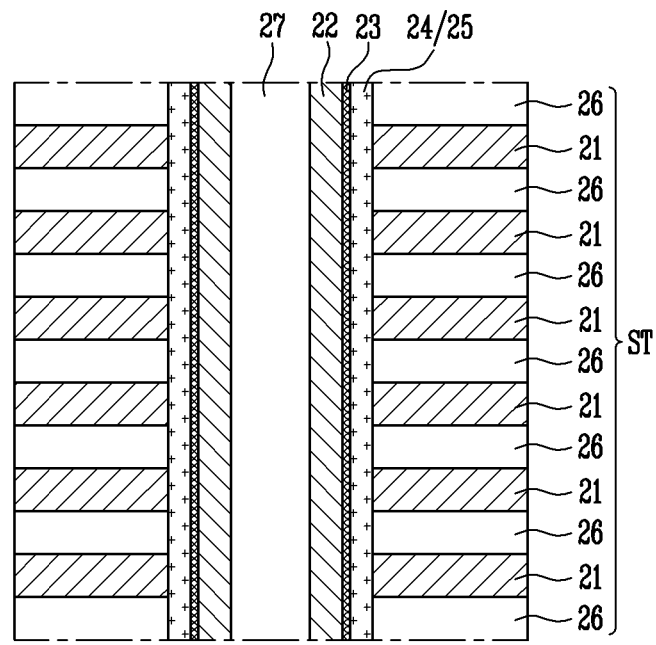
FIGS. 9A to 9C are cross-sectional views illustrating structures of semiconductor devices according to embodiments of the present disclosure.
Figure 9B:
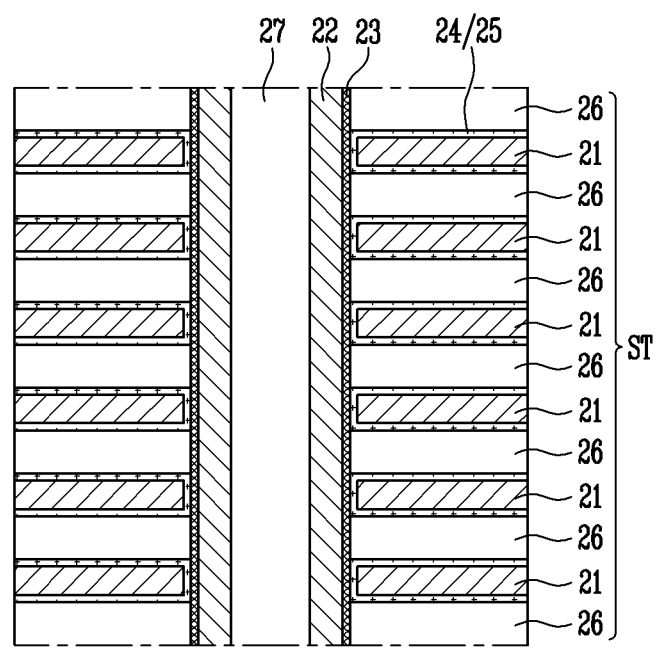
Figure 9C:
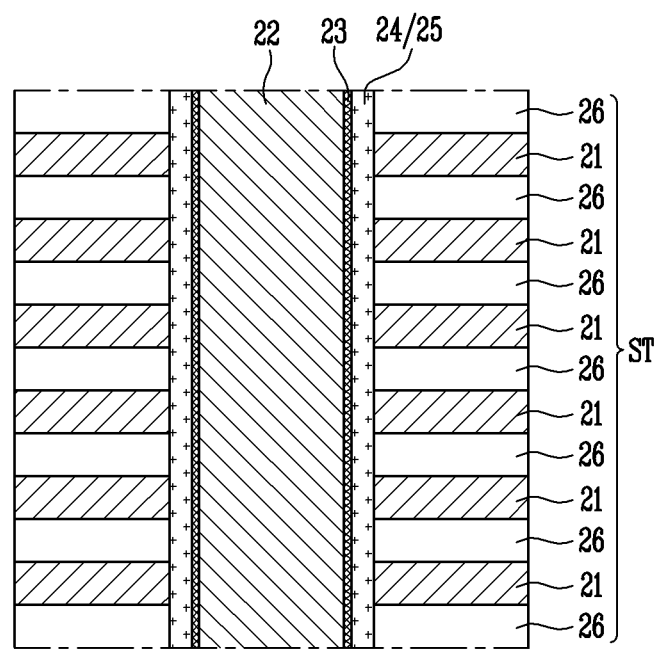

FIGS. 9A to 9C are cross-sectional views illustrating structures of semiconductor devices according to embodiments of the present disclosure. Descriptions of certain elements that have been discussed above are omitted below for the sake of brevity.

Referring to FIGS. 9A to 9C, semiconductor devices of embodiments of the disclosure may each include a stacked structure ST, a ferroelectric layer 23 and a second conductive layer 22, and may further include a switching layer 24 or a variable resistance layer 25. In some embodiments, the semiconductor device may further include a gap-filling layer 27.

The stacked structure ST may include first conductive layers 21 and insulating layers 26 that are stacked on each other in an alternating manner. The first conductive layers 21 may include, for example, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), polysilicon, or a combination thereof. The first conductive layers 21 may be word lines or bit lines. The insulating layers 26 may be provided for insulating the first conductive layers 21 and may include an insulating material such as oxide or nitride.

The second conductive layer 22 may pass through the stacked structure ST. Referring to FIGS. 9A and 9B, in some embodiments, the second conductive layer 22 may have an open central region, and in such instances a gap-filling layer 27 may be used to fill the open central region of second conductive layer 22. However, referring to FIG. 9C, in other embodiments, the second conductive layer 22 may not have an open central region and may be filled up, and therefore a gap-filling layer 27 may not be formed in the second conductive layer 22.

The second conductive layer 22 may include, for example, tungsten (W), tungsten nitride (WNx), tungsten silicide (WSix), titanium (Ti), titanium nitride (TiNx), titanium silicon nitride (TiSiN), titanium aluminum nitride (TiAlN), tantalum (Ta), tantalum nitride (TaN), tantalum silicon nitride (TaSiN), tantalum aluminum nitride (TaAlN), carbon (C), silicon carbide (SiC), silicon carbon nitride (SiCN), copper (Cu), zinc (Zn), nickel (Ni), cobalt (Co), lead (Pb), platinum (Pt), polysilicon, or a combination thereof. The second conductive layer 22 may be a word line or a bit line.

The switching layer 24 or the variable resistance layer 25 may be interposed between the second conductive layer 22 and the first conductive layers 21. The switching layer 24 or the variable resistance layer 25 may be formed to surround a sidewall of the second conductive layer 22.

The ferroelectric layer 23 may be interposed between the switching layer 24 and the second conductive layer 22, or between the variable resistance layer 25 and the second conductive layer 22. Referring to FIGS. 9A and 9C, in some embodiments, the ferroelectric layer 23 may surround the outer sidewall of the second conductive layer 22. The switching layer 24 or the variable resistance layer 25 may surround the outer sidewall of the ferroelectric layer 23. Referring to FIG. 9B, a switching layer 24 or a variable resistance layer 25 may be interposed between the ferroelectric layer 23 and the first conductive layer 21 and extend between the first conductive layers 21 and the insulating layers 26. The switching layer 24 or the variable resistance layer 25 may have a C-shaped cross-section. As a result, the outer sidewall of the ferroelectric layer 23 may contact, in the stack direction, alternating layers of the insulating layers 26 and the switching layer 24 or the variable resistance layer 25.

According to the above-described structures, memory cells may be located at areas of intersection between the first conductive layers 21 and the second conductive layer 22. According to an embodiment, the first conductive layers 21 may be word lines and the second conductive layer 22 may be a bit line. In this embodiment, during a positive program operation, the memory cells may be programmed to have relatively low threshold voltages by applying a positive program voltage to the first conductive layers 21. In addition, during a negative program operation, the memory cells may be programmed to have relatively high threshold voltages by applying a negative program voltage to the first conductive layers 21. During a read operation, a positive read voltage may be applied to the first conductive layers 21.

Figure 10:
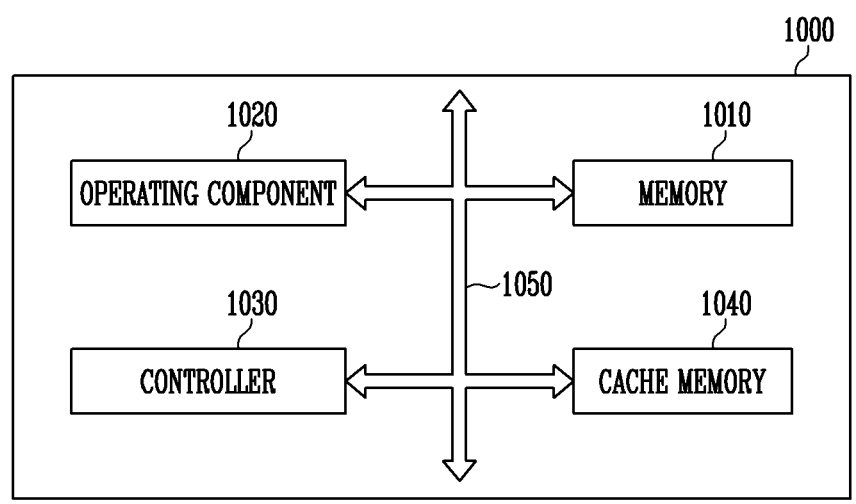
FIG. 10 is a diagram illustrating a configuration of a microprocessor implementing a memory device according to an embodiment of the present disclosure.

FIG. 10 a diagram illustrating a configuration of a microprocessor implementing a memory device according to an embodiment of the present disclosure.

Referring to FIG. 10, a microprocessor 1000 may control and adjust a series of processes of receiving data from various types of external devices, processing the data and sending results to external devices. The microprocessor 1000 may include a memory 1010, an operating component 1020, and a controller 1030. The microprocessor 1000 may be various data processing units such as a central processing unit (CPU), a graphic processing unit (GPU), a digital signal processor (DSP) and an application processor (AP).

The memory 1010 may be a processor register or a register, and may store data in the microprocessor 1000. The memory 1010 may include various types of registers including a data register, an address register, and a floating point register. The memory 1010 may serve to temporarily store an address at which data on which an operation is to be performed, data corresponding to a result of the operation, and data for performing the operation.

The memory 1010 may include at least one of the embodiments of the above-described semiconductor devices. For example, the memory 1010 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. Therefore, the integration density and operating characteristics of the memory 1010 may be improved. As a result, operating characteristics of the microprocessor 1000 may be improved.

The operating component 1020 may perform various arithmetic operations or logical operations according to a result obtained by decoding an instruction by the controller 1030. The operating component 1020 may include at least one arithmetic and logic unit (ALU).

The controller 1030 may receive signals from the memory 1010, the operating component 1020 and the external devices of the microprocessor 1000, extract or decode a command, control the signal input and output of the microprocessor 1000, and execute processing represented by program.

According to the present disclosure, the microprocessor 1000 may further include a cache memory 1040 that may temporarily store data input from an external device in addition to the memory 1010, or data to be output to the external device. The cache memory 1040 may exchange data with the memory 1010, the operating component 1020 and the controller 1030 through a bus interface 1050.

Figure 11:
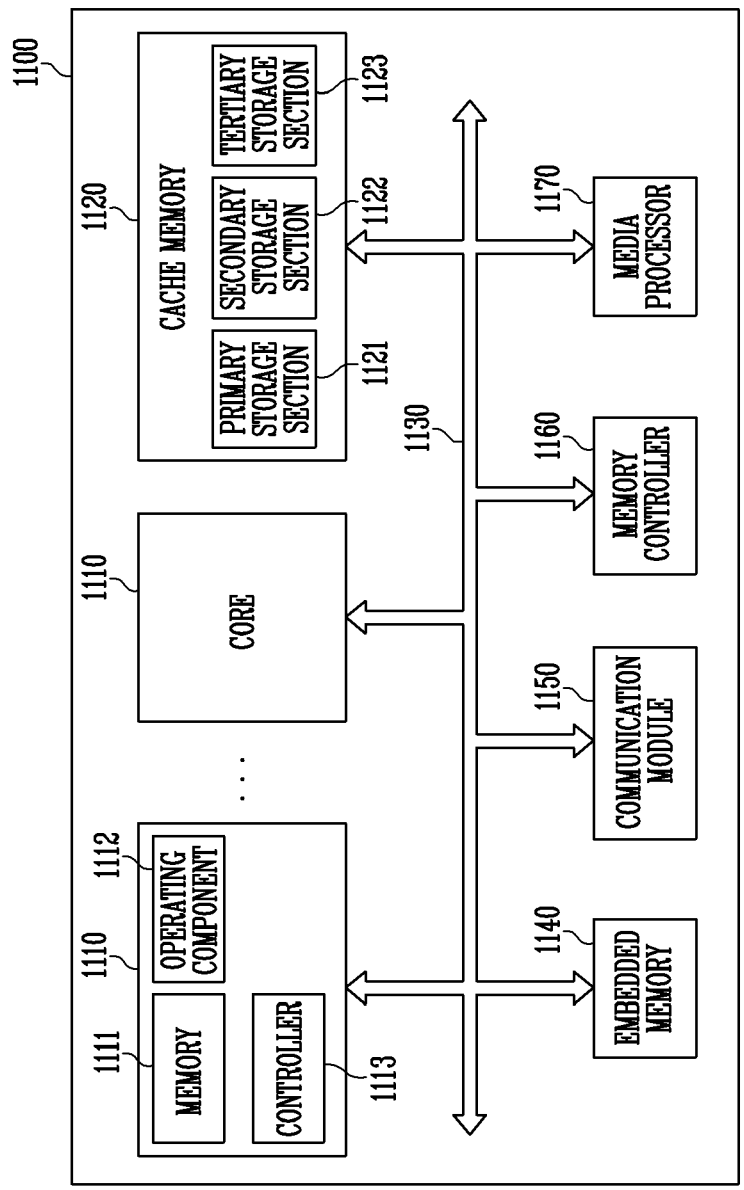
FIG. 11 is a diagram illustrating a configuration of a processor implementing a memory device according to an embodiment of the present disclosure.

FIG. 11 is a diagram illustrating a configuration of a processor implementing a memory device according to an embodiment of the present disclosure.

Referring to FIG. 11, a processor 1100 may improve performance and perform multiple functions in addition to the functions of a microprocessor controlling and adjusting a series of processes of receiving and processing data from various external devices and sending results thereof to the external devices. The processor 1100 may include a core 1110 serving as a microprocessor, a cache memory 1120 temporarily storing data, and a bus interface 1130 for data transfer between internal and external devices. The processor 1100 may include various types of systems on chip (SoCs) such as a multi-core processor, a graphic processing unit (GPU), and an application processor (AP), for example.

According to an embodiment of the present disclosure, the core 1110 may perform arithmetic and logic operations on the data input from the external device and may include a memory 1111, an operating component 1112 and a controller 1113.

The memory 1111 may be a processor register or a register, and may store data in the processor 1100. The memory 1111 may include various types of registers including a data register, an address register, and a floating point register. The memory 1111 may serve to temporarily store an address at which data on which an operation is to be performed, data corresponding to a result of the operation, and data for performing the operation. The operating component 1112 may perform an operation in the processor 1100. More specifically, the operating component 1112 may perform various fundamental arithmetic operations or logical operations according to a result of decoding an instruction. The operating component 1112 may include at least one arithmetic and logic unit (ALU). The controller 1113 may receive signals from the memory 1111, the operating component 1112 and the external devices of the processor 1100, extract or decode a command, control signal input and output of the processor 1100, and execute processing represented by program.

The cache memory 1120 may temporarily store data so as to compensate for the difference in data processing speed between the core 1110 operating at a high speed and the external device operating at a low speed. The cache memory 1120 may include a primary storage section 1121, a secondary storage section 1122 and a tertiary storage section 1123. In general, the cache memory 1120 may include the primary and secondary storage sections 1121 and 1122. When high capacity is required, the cache memory 1120 may further include the tertiary storage section 1123. If necessary, the cache memory 1120 may include more storage sections. In other words, the number of storage sections included in the cache memory 1120 may vary depending on the design. The primary, secondary and tertiary storage sections 1121, 1122 and 1123 may have the same or different processing speeds for storing and determining data. When the respective storage sections have different processing speeds, the primary storage section 1121 may have the highest processing speed among the primary, secondary, and tertiary storage sections 1121, 1122 and 1123. At least one of the primary, secondary and tertiary storage sections 1121, 1122 and 1123 may include at least one of the embodiments of the above-described semiconductor device. For example, the cache memory 1120 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. As a result, operating characteristics of the processor 1100 may be improved.

As illustrated in FIG. 11, all of the primary, secondary and tertiary storage sections 1121, 1122 and 1123 may be included in the cache memory 1120. However, the primary, secondary and tertiary storage sections 1121, 1122 and 1123 of the cache memory 1120 may be provided outside of the core 1110 to compensate for the difference in processing speeds of the core 1110 and the external device. Alternatively, the primary storage section 1121 of the cache memory 1120 may be located in the core 1110, and the secondary storage section 1122 and the tertiary storage section 1123 may be provided outside of the core 1110 to enhance the function of supplementing the difference in data processing speed. However, the primary and secondary storage sections 1121 and 1122 may be located in the core 1110 and the tertiary storage section 1123 may be located outside the core 1110.

The bus interface 1130 may connect the core 1110, the cache memory 1120 and the external device so that data may be efficiently transferred.

According to an embodiment of the present disclosure, the processor 1100 may include a plurality of cores 1110, which may share the cache memory 1120. The plurality of cores 1110 and the cache memory 1120 may be directly coupled to each other, or may be coupled through the bus interface 1130. Each of the plurality of cores 1110 may have the same configuration as the above-described core. When the processor 1100 includes the plurality of cores 1110, the number of primary storage sections 1121 of the cache memory 1120 may correspond to the number of cores 1110. Each of the primary storage sections 1121 of the cache memory 1120 may be included in each of the cores 1110. In addition, the secondary storage section 1122 and the tertiary storage section 1123 may be provided outside of the plurality of cores 1110 and shared through the bus interface 1130. The primary storage section 1121 may have a faster processing speed than the secondary and tertiary storage sections 1122 and 1123. In another embodiment, the number of primary storage sections 1121 and the number of secondary storage sections 1122 may correspond to the number of cores 1110. Each of the primary storage sections 1121 and each of the secondary storage sections 1122 may be included in each of the cores 1110. The tertiary storage section 1123 may be provided outside of the plurality of cores 1110 and shared by the plurality of cores 1110 through the bus interface 1130.

According to an embodiment of the present disclosure, the processor 1100 may include an embedded memory 1140 storing data, a communication module 1150 wiredly or wirelessly transmitting or receiving the data to or from an external device, a memory controller 1160 driving an external memory device, and a media processor 1170 processing or outputting data, processed by the processor 1100 or input from the external input device, to an external interface device. The processor 1100 may further include various modules and devices. The added modules may exchange data with each other and with the core 1110 and the cache memory 1120 through the bus interface 1130.

The embedded memory 1140 may include a non-volatile memory as well as a volatile memory. A volatile memory may include dynamic random access memory (DRAM), a Mobile DRAM, Static Random Access Memory (SRAM), and memory with similar functions. A non-volatile memory may include Read Only Memory (ROM), NOR Flash Memory, NAND Flash Memory, Phase Change Random Access Memory (PRAM), Resistive Random Access Memory (RRAM), Spin Transfer Torque Random Access Memory (STTRAM), Magnetic Random Access Memory (MRAM), and a memory with similar functions.

The communication module 1150 may include a module connected to a wired network, a module connected to a wireless network, or both. A wired network module may include a Local Area Network (LAN), a Universal Serial Bus (USB), an Ethernet, Power Line Communication (PLC), or the like, which transmits and receives data through a transmission line. A wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), or the like, which transmits and receives data without a transmission line.

The memory controller 1160 may include various controllers for processing and managing data transferred between the processor 1100 and an external storage device, which operates according to a different communication standard from that of the processor 1100. For example, the memory controller 1160 may include a controller controlling Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multimedia card (MMC), an embedded MMC (eMMC), a compact flash (CF) card, or the like.

The media processor 1170 may process data processed by the processor 1100, or data in the form of video or audio or in another form, which is input from an external input device, and may output the processed data to an external interface device. The media processor 1170 may include a Graphics Processing Unit (GPU), a Digital Signal Processor (DSP), a High Definition Audio (HD audio), a high definition multimedia interface (HDMI) controller, or the like.

Figure 12:
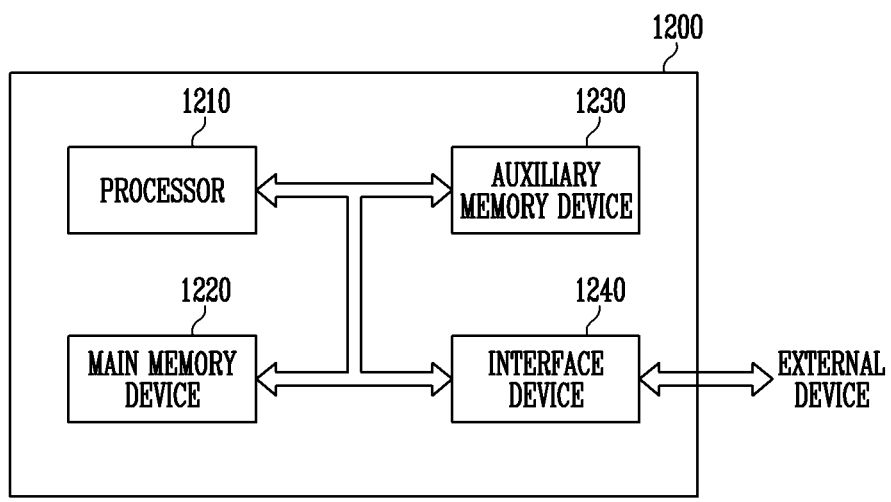
FIG. 12 is a diagram illustrating a configuration of a system implementing a memory device according to an embodiment of the present disclosure.

FIG. 12 is a diagram illustrating a configuration of a system implementing a memory device according to an embodiment of the present disclosure.

Referring to FIG. 12, a system 1200 may refer to a device configured to process data. To perform a series of manipulations for data, the system 1200 may perform input, processing, output, communication, storage, and the like to perform a series of operations on data. The system 1200 may include a processor 1210, a main memory device 1220, an auxiliary memory device 1230, and an interface device 1240. According to an embodiment of the present disclosure, the system 1200 may be a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, telematics, an audio visual (AV) system, or a smart television.

The processor 1210 may control the decoding of input commands and the processing of the data stored in the system 1200, such as operation and comparison of the data. The processor 1210 may include one or more of a microprocessor unit (MPU), a central processing unit (CPU), a single/multi-core processor, a graphic processing unit (GPU), an application processor (AP), a digital signal processor (DSP), and so on.

The main memory device 1220 may refer to a storage where program codes or material are moved from the auxiliary memory device 1230, and are stored and executed when program is executed. The stored data may be retained even in the absence of power supply. The main memory device 1220 may include at least one of the embodiments of the above-described semiconductor device. For example, the main memory device 1220 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. As a result, operating characteristics of the main memory device 1220 may be improved. As a result, operating characteristics of the system 1200 may be improved.

In addition, the main memory device 1220 may further include a volatile static random access memory (SRAM) or a volatile dynamic random access memory (DRAM), which loses all data when power supply is blocked. In another example, the main memory device 1220 may not include the semiconductor device according to the above-described embodiment and may include a volatile static random access memory (SRAM) or a volatile dynamic random access memory (DRAM), which loses all data when power supply is blocked.

The auxiliary memory device 1230 may refer to a memory device designed to store program codes or data. Although the auxiliary memory device 1230 is slower than the main memory device 1220, the auxiliary memory device 1230 may store more data than the main memory device 1220. The auxiliary memory device 1230 may include at least one of the embodiments of the above-described semiconductor device. For example, the auxiliary memory device 1230 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. As a result, the integration density and operating characteristics of the auxiliary memory device 1230 may be improved. As a result, operating characteristics of the system 1200 may be improved.

In addition, the auxiliary memory device 1230 may further include a data storage system 1300 as shown below in FIG. 13, such as a magnetic tape using magnetism, a magnetic disk, a laser disc using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on. However, in contrast thereto, the auxiliary memory device 1230 may not include the semiconductor device according to the above-described embodiment and may further include the data storage system 1300 as shown in FIG. 13, such as a magnetic tape using magnetism, a magnetic disk, a laser disc using optics, a magneto-optical disc using both magnetism and optics, a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, and so on.

The interface device 1240 may perform exchange of commands and data between the system 1200 of this embodiment and an external device. The interface device 1240 may be a keypad, a keyboard, a mouse, a speaker, a microphone, a display, various human interface devices (HIDs), a communication device, and so on. The communication device may include either or both a module connected to a wired network and a module connected to a wireless network. The wired network module may include a Local Area Network (LAN), a Universal Serial Bus (USB), an Ethernet, Power Line Communication (PLC) in the same manner as in various devices that transmit and receive data through transmission lines. The wireless network module may include Infrared Data Association (IrDA), Code Division Multiple Access (CDMA), Time Division Multiple Access (TDMA), Frequency Division Multiple Access (FDMA), a Wireless LAN, Zigbee, a Ubiquitous Sensor Network (USN), Bluetooth, Radio Frequency IDentification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like in the same manner as in various devices that transmit and receive data without a transmission line.

Figure 13:
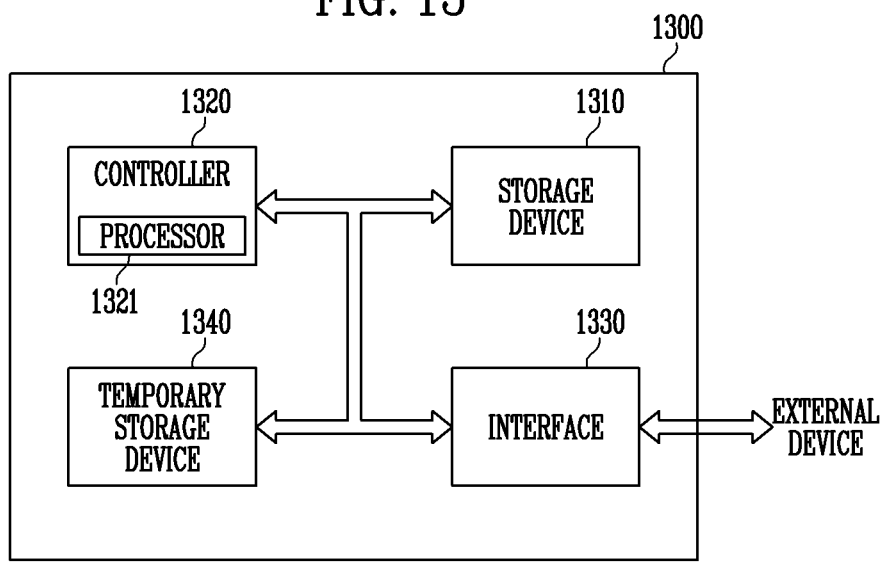
FIG. 13 is a diagram illustrating a configuration of a data storage system implementing a memory device according to an embodiment of the present disclosure.

FIG. 13 is a diagram illustrating a configuration of a data storage system implementing a memory device according to an embodiment of the present disclosure.

Referring to FIG. 13, a data storage system 1300 may include a storage device 1310, which has a nonvolatile characteristic as a component for storing data, a controller 1320 that controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), and a solid state disk (SSD), and a card type such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card.

The storage device 1310 may include a non-volatile memory that stores data semi-permanently. The non-volatile memory may include a read only memory (ROM), a NOR flash memory, a NAND flash memory, a phase change random access memory (PRAM), a resistive random access memory (RRAM), and a magnetic random access memory (MRAM).

The controller 1320 may control data exchange between the storage device 1310 and the interface 1330. The controller 1320 may include a processor 1321 for performing an operation for processing commands input through the interface 1330 from an external device of the data storage system 1300.

The interface 1330 may be provided to exchange commands and data between external devices. When the data storage system 1300 is a card type device, the interface 1330 may be compatible with interfaces that are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces that are used in devices similar to the above-mentioned devices. If the data storage system 1300 is a disk type device, then the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like. The interface 1300 may be compatible with interfaces that are similar to these interfaces. The interface 1330 may be compatible with one or more interfaces having different types.

The temporary storage device 1340 may store data temporarily for efficiently transferring data between the interface 1330 and the storage device 1310 according to diversifications and high performance of an interface with an external device, a controller and a system. The temporary storage device 1340 may include at least one of the embodiments of the above-described semiconductor device. For example, the temporary storage device 1340 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. Therefore, operating characteristics of the temporary storage device 1340 may be improved. As a result, operating characteristics of the data storage system 1300 may be improved.

Figure 14:
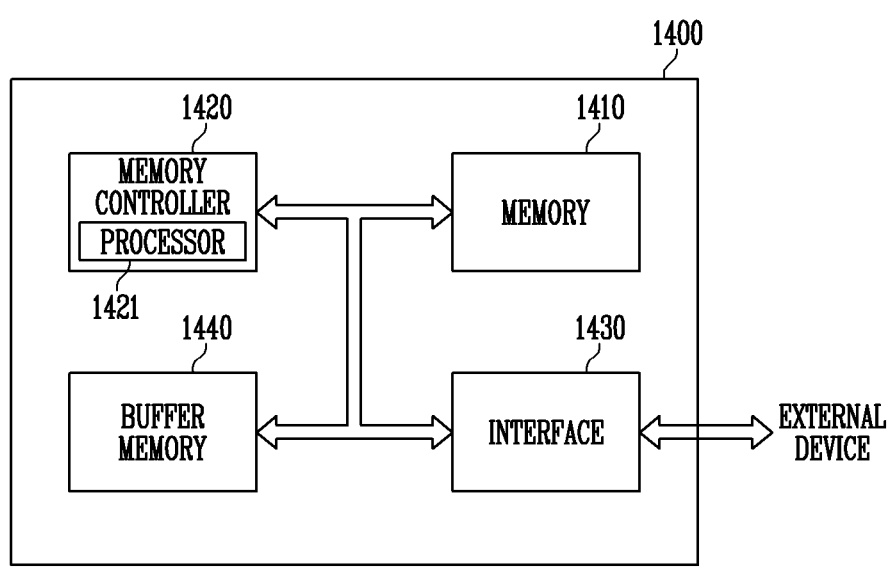
FIG. 14 is a diagram illustrating a configuration of a memory system implementing a memory device according to an embodiment of the present disclosure.

FIG. 14 is a diagram illustrating a configuration of a memory system implementing a memory device according to an embodiment of the present disclosure.

Referring to FIG. 14, a memory system 1400 may include a memory 1410, which has a nonvolatile characteristic as a component for storing data, a memory controller 1420 that controls the memory 1410, and an interface 1430 for connection with an external device. The memory system 1400 may be a card type device such as a solid state disk (SSD), a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), a compact flash (CF) card, or the like.

The memory 1410 storing data may include at least one of the embodiments of the above-described semiconductor device. For example, the memory 1410 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. Thus, operating characteristics of the memory 1410 may be improved. As a result, operating characteristics of the memory system 1400 may be improved.

The memory according to this embodiment may include a read only memory (ROM), a NOR flash memory, a NAND flash memory, a phase change random access memory (PRAM), a resistive random access memory (RRAM), and a magnetic random access memory (MRAM).

The memory controller 1420 may control data exchange between the memory 1410 and the interface 1430. The memory controller 1420 may include a processor 1421 for performing an operation for processing commands input through the interface 1430 from an external device of the memory system 1400.

The interface 1430 may be provided to exchange commands and data between the memory system 1400 and the external device. The interface 1430 may be compatible with interfaces that are used in devices, such as a universal serial bus (USB) memory, a secure digital (SD) card, a mini secure digital (mSD) card, a micro secure digital (SD) card, a secure digital high capacity (SDHC) card, a memory stick card, a smart media (SM) card, a multimedia card (MMC), an embedded MMC (eMMC), and a compact flash (CF) card, or may be compatible with interfaces that are used in devices similar to the above-mentioned devices. The interface 1430 may be compatible with one or more interfaces having different types.

According to this embodiment, the memory system 1400 may further include a buffer memory 1440 for efficient transfer of data input and output between the interface 1430 and the memory 1410 according to diversification and high performance of an interface with an external device, a memory controller and a memory system. The buffer memory 1440 temporarily storing data may include at least one of the embodiments of the above-described semiconductor device. For example, the buffer memory 1440 may include a memory cell. The memory cell may include a first electrode, a second electrode, a chalcogenide layer located between the first electrode and the second electrode and maintaining an amorphous state, and a ferroelectric layer located between the chalcogenide layer and the second electrode. As a result, operating characteristics of the memory system 1400 may be improved.

In addition, according to this embodiment, the buffer memory 1440 may further include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic. However, in other embodiments, the buffer memory 1440 may not include the semiconductor device according to the above-described embodiment and may further include a static random access memory (SRAM) or a dynamic random access memory (DRAM), which has a volatile characteristic, and a Read Only Memory (ROM), a NOR Flash Memory, a NAND Flash Memory, a phase change random access memory (PRAM), a resistive random access memory (RRAM), a spin transfer torque random access memory (STTRAM), or a magnetic random access memory (MRAM), which has a nonvolatile characteristic.

According to an embodiment of the present disclosure, operating characteristics and reliability of a semiconductor device may be improved.

In the above-discussed embodiments, all steps may be selectively performed or skipped. In addition, the steps in each embodiment may not always be performed in regular order. Furthermore, the embodiments disclosed in the present specification and the drawings aims to help those with ordinary knowledge in this art more clearly understand the present disclosure rather than aiming to limit the bounds of the present disclosure. In other words, one of ordinary skill in the art to which the present disclosure belongs will be able to easily understand that various modifications are possible based on the technical scope of the present disclosure. It will be apparent to those skilled in the art that various modifications can be made to the above-described exemplary embodiments of the present disclosure without departing from the spirit or scope of the invention. Thus, it is intended that the present disclosure cover all such modifications provided they come within the scope of the appended claims and their equivalents.

What is claimed is:

1. A memory cell, comprising:
   a first electrode;
   a second electrode;
   a variable resistance layer located between the first electrode and the second electrode, and reversibly transitioning between different resistance states; and
   a ferroelectric layer located between the variable resistance layer and the second electrode,
   wherein the variable resistance layer is maintained in an amorphous state during a program operation.

2. The memory cell of claim 1, wherein the memory cell has a first threshold voltage after a positive program operation and the memory cell has a second threshold voltage after a negative program operation, and
   wherein the second threshold voltage is greater than the first threshold voltage.

3. The memory cell of claim 2, wherein a read voltage is between the first threshold voltage and the second threshold voltage.

4. The memory cell of claim 1, wherein the variable resistance layer has a low-resistance amorphous state after a set operation and the variable resistance layer has a high-resistance amorphous state after a reset operation.

5. The memory cell of claim 1, wherein the variable resistance layer includes a chalcogenide.

6. The memory cell of claim 1, wherein during a positive program operation, a positive program voltage is applied to the first electrode and causes polarization of the ferroelectric layer.

7. The memory cell of claim 1, wherein during a negative program operation, a negative program voltage is applied to the first electrode and causes polarization of the ferroelectric layer.

8. A method of operating a memory cell including a first electrode, a second electrode, a variable resistance layer located between the first electrode and the second electrode, and a ferroelectric layer located between the variable resistance layer and the second electrode, the method comprising:
   applying a positive program voltage to the first electrode, wherein the positive program voltage causes polarization of the ferroelectric layer; and
   applying a read voltage that does not polarize the ferroelectric layer to the memory cell.

9. The method of claim 8, wherein the variable resistance layer is maintained in an amorphous state after the positive program voltage is applied.

10. The method of claim 8, wherein the variable resistance layer includes a chalcogenide.

11. The method of claim 8, wherein a resistance of the variable resistance layer is reduced by the positive program voltage.

12. The method of claim 8, further comprising
    applying a negative program voltage to the first electrode, wherein the negative program voltage causes polarization of the ferroelectric layer.

13. The method of claim 12, wherein a resistance of the variable resistance layer is increased by the negative program voltage.

14. A method of operating a memory cell including a first electrode, a second electrode, a switching layer located between the first electrode and the second electrode, and a ferroelectric layer located between the switching layer and the second electrode, the method comprising:
  applying a positive program voltage to the first electrode, wherein the positive program voltage causes polarization of the ferroelectric layer; and
  applying a read voltage that does not polarize the ferroelectric layer to the memory cell.

15. The method of claim 14, further comprising
  applying a negative program voltage to the first electrode, wherein the negative program voltage causes polarization of the ferroelectric layer.

16. The method of claim 14, wherein the switching layer includes a chalcogenide layer and the switching layer is maintained in an amorphous state after the positive program voltage is applied.

* * * * *